United States Patent
Matsuura et al.

(10) Patent No.: US 10,840,180 B2
(45) Date of Patent: Nov. 17, 2020

(54) PRODUCTION METHOD FOR MULTILAYER WIRING BOARD

(71) Applicant: MITSUI MINING & SMELTING CO., LTD., Tokyo (JP)

(72) Inventors: Yoshinori Matsuura, Ageo (JP); Takenori Yanai, Ageo (JP); Toshimi Nakamura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 16/339,806

(22) PCT Filed: Oct. 6, 2016

(86) PCT No.: PCT/JP2016/079856
§ 371 (c)(1),
(2) Date: Apr. 5, 2019

(87) PCT Pub. No.: WO2018/066114
PCT Pub. Date: Apr. 12, 2018

(65) Prior Publication Data
US 2020/0045829 A1    Feb. 6, 2020

(51) Int. Cl.
*H01L 23/522*      (2006.01)
*H01L 23/498*      (2006.01)
(Continued)

(52) U.S. Cl.
CPC ...... *H01L 23/5226* (2013.01); *H01L 21/4857* (2013.01); *H01L 23/32* (2013.01); *H01L 23/49822* (2013.01)

(58) Field of Classification Search
None
See application file for complete search history.

(56) References Cited

U.S. PATENT DOCUMENTS

| | | |
|---|---|---|
| 2004/0056344 A1 | 3/2004 | Ogawa et al. |
| 2007/0119541 A1 | 5/2007 | Kawabata et al. |

(Continued)

FOREIGN PATENT DOCUMENTS

| | | |
|---|---|---|
| JP | 2003-158239 | 5/2003 |
| JP | 2005-101137 | 4/2005 |

(Continued)

OTHER PUBLICATIONS

International Search Report (ISR) from International Searching Authority (Japan Patent Office) in International Pat. Appl. No. PCT/JP2016/079856, dated Dec. 20, 2016, together with an English language translation.

(Continued)

*Primary Examiner* — Cheung Lee
(74) *Attorney, Agent, or Firm* — Greenblum & Bernstein, P.L.C.

(57) ABSTRACT

A method of manufacturing a multilayer wiring board is disclosed, the method being capable of reinforcing the multilayer wiring layer and thereby improving the reliability of connection and the flatness on the surface of the multilayer wiring layer. The method includes providing a laminated sheet having a substrate, a first release layer and a metal layer; forming a first wiring layer on the metal layer; alternately stacking insulating layers and wiring layers on the laminated sheet on which the first wiring layer is formed to give a laminate provided with a multilayer wiring layer; stacking a reinforcing sheet on the laminate provided with the multilayer wiring layer at the side opposite to the laminate sheet, while interposing the second release layer; separating the substrate from the metal layer; and separating the reinforcing sheet from the laminate provided with the multilayer wiring layer to give the multilayer wiring board.

12 Claims, 3 Drawing Sheets

(51) Int. Cl.
 *H01L 21/48* (2006.01)
 *H01L 23/32* (2006.01)

(56) References Cited

U.S. PATENT DOCUMENTS

| | | | |
|---|---|---|---|
| 2008/0012140 A1* | 1/2008 | Tsukano | H01L 21/4846 257/758 |
| 2008/0308308 A1 | 12/2008 | Kobayashi | |
| 2013/0069245 A1 | 3/2013 | Uchiyama | |
| 2013/0303669 A1 | 11/2013 | Morimoto et al. | |
| 2014/0150258 A1 | 6/2014 | Shimizu et al. | |
| 2017/0358507 A1* | 12/2017 | Mori | H01L 22/32 |

FOREIGN PATENT DOCUMENTS

| | | |
|---|---|---|
| JP | 2007-150002 | 6/2007 |
| JP | 2008-251702 | 10/2008 |
| JP | 2013-069808 | 4/2013 |
| JP | 2013-237721 | 11/2013 |
| JP | 2014-110390 | 6/2014 |
| JP | 2014-214208 | 11/2014 |
| JP | 2015-035551 | 2/2015 |
| JP | 2015-170767 | 9/2015 |
| WO | 2014/054811 | 4/2014 |

OTHER PUBLICATIONS

Written Opinion of the International Searching Authority (Japan Patent Office) in International Pat. Appl. No. PCT/JP2016/079856, dated Dec. 20, 2016, together with an English language translation.

\* cited by examiner

PRODUCTION METHOD FOR MULTILAYER WIRING BOARD

TECHNICAL FIELD

The present invention relates to a method of manufacturing a multilayer wiring board.

BACKGROUND ART

In recent years, multilayering of printed wiring boards has been widely prevailed in order to increase the mounting density of printed wiring boards and miniaturize the boards. Such multilayer printed wiring boards have been mostly used in portable electronic devices for the purpose of weight reduction and miniaturization. These multilayer printed wiring boards require a further reduction in thickness of an interlayer insulating layer and a further reduction in weight of a wiring board.

A technique that satisfies such a requirement employs a method of manufacturing a multilayer printed wiring board by a coreless build-up process. In the coreless build-up process, insulating layers and wiring layers are alternately stacked (built up) on a so-called core (core material) by a procedure called a build-up process to form a multilayer, and then the core (core material) is removed to form a wiring board with only the build-up layer. In the coreless build-up process, the use of a copper foil with a carrier has been proposed such that a support and the multilayer printed wiring board can be readily separated. For example, PTL 1 (JP2005-101137A) discloses a method of manufacturing a packaging substrate for mounting semiconductor devices, the method comprising bonding an insulating resin layer to a carrier surface of a copper foil with a carrier to form a support; forming a first wiring conductor through a photoresist process on the extremely thin copper layer of the copper foil with a carrier, a patterned electroplating process of copper, and a removing process of the photoresist; forming a build-up wiring layer; separating a support substrate with a carrier; and removing the extremely thin copper layer.

In particular, further miniaturization and power saving of electronic devices increasingly require high integration and thinning of semiconductor chips and printed wiring boards. Recently, the introduction of FO-WLP (fan-out wafer level packaging) and FO-PLP (fan-out panel level packaging) have been studied as next generation packaging technologies that satisfy such a demand. The use of a coreless build-up process is also being studied in the FO-WLP and the FO-PLP. One of such methods includes a process called an RDL-first (redistribution layer-first) process, in which a wiring layer and an optional build-up wiring layer are formed on the surface of a coreless support, the support is separated as required, and then the chips are mounted.

For example, PTL 2 (JP2015-35551A) discloses a method of manufacturing a semiconductor device, the method comprising forming a metal release layer on a main surface of a support made of a glass or silicon wafer; forming an insulating resin layer on the metal release layer; forming a redistribution layer including a build-up layer on the insulating resin layer; mounting and sealing a semiconductor integrated circuit on the redistribution layer; exposing the release layer by removal of the support; exposing a secondary mounting pad by removal of the release layer; forming solder bumps on the surface of the secondary mounting pad; and performing secondary mounting. PTL 3 (JP2008-251702A) discloses a method of manufacturing a semiconductor device, the method comprising forming an embedded wiring layer as a first electrode pad on a coreless support; forming another embedded wiring layer as a second electrode pad on the embedded wiring layer; removing the coreless support; and then mounting a chip from the back side of the embedded wiring layer. PTL 4 (JP2015-170767A) discloses a method of manufacturing a circuit board, the method comprising forming a release layer on a coreless support; forming an embedded wiring layer and a build-up layer on the release layer, mounting a wiring board on the surface of the build-up layer; removing a carrier; and mounting a semiconductor chip. This release layer contains a composition that generates gas caused by irradiation with ultraviolet rays, and this may make it easy to separate the support and remove the release layer without damaging the wiring layer.

Also, adhesive sheets having both tackiness and separability are known. For example, PTL 5 (JP2014-214208A) discloses an adhesive sheet comprising a porous material layer and an adhesive layer containing a thermal foaming agent. As described herein, the porous material layer is composed of a porous fiber, paper or resin material, and the adhesive layer containing a thermal foaming agent is composed of a mixture of a microcapsulated thermal foaming agent and an acrylic polymer produced through solution polymerization or emulsion polymerization. PTL 6 (JP2013-237721A) discloses a re-separable water dispersible acrylic adhesive composition containing an acrylic emulsion polymer, a perfluoroalkylated oligomer, and an ionic compound, wherein the acrylic emulsion polymer is composed of an alkyl (meth)acrylate and an unsaturated monomer containing carboxyl groups.

CITATION LIST

Patent Literatures

PTL 1: JP2005-101137A
PTL 2: JP2015-35551A
PTL 3: JP2008-251702A
PTL 4: JP2015-170767A
PTL 5: JP2014-214208A
PTL 6: JP2013-237721A

SUMMARY OF INVENTION

Thinning of a build-up layer is required in view of recent technical trends to employ FO-WLP and FO-PLP as described above. However, in the case of a thin build-up layer, large local warpage of the build-up layer may occur when removing a substrate at a release layer from the substrate provided with the build-up layer produced by a coreless build-up process. Such a large warpage of the buildup layer may cause disconnection and separation of the wiring layer inside the build-up layer, and thereby decrease the reliability of connection in the wiring layer.

The present inventors have now found that in the manufacturing of a multilayer wiring board, a reinforcing sheet having a lower Vickers hardness than that of a substrate is stacked on a laminate provided with a multilayer wiring layer including a releasable substrate, and the reliability of connection in the multilayer wiring layer and the flatness (coplanarity) on the surface of the multilayer wiring layer can be improved because the multilayer wiring layer can be reinforced without large local warpage.

Accordingly, an object of the present invention is to provide a method of manufacturing a multilayer wiring board capable of reinforcing the multilayer wiring layer without large local warpage and thereby improving the reliability of connection in the multilayer wiring layer and the flatness (coplanarity) on the surface of the multilayer wiring layer.

In one embodiment of the present invention, a method of manufacturing a multilayer wiring board is provided, the method comprising the steps of:

providing a laminated sheet including, in sequence, a substrate, a first release layer, and a metal layer;

forming a first wiring layer on the metal layer;

alternately stacking insulating layers and wiring layers on the laminated sheet on which the first wiring layer is formed to give a laminate provided with a multilayer wiring layer, the first wiring layer being incorporated in the form of an embedded wiring layer;

stacking a reinforcing sheet having a lower Vickers hardness than that of the substrate on the laminate provided with the multilayer wiring layer at the side opposite to the laminated sheet, while interposing a second release layer;

separating the substrate from the metal layer at the first release layer; and separating the reinforcing sheet from the laminate provided with the multilayer wiring layers at the second release layer to give a multilayer wiring board.

DESCRIPTION OF EMBODIMENTS

Method of Manufacturing Multilayer Wiring Board

A method of manufacturing a multilayer wiring board according to the present invention comprises the steps of (1) providing a laminated sheet, (2) forming a first wiring layer, (3) forming a laminate provided with a multilayer wiring layer, (4) stacking a reinforcing sheet, (5) separating a substrate, (6) optionally removing a metal layer by etching, (7) optionally treating a surface of the first wiring layer, (8) optionally mounting an electronic device, and (9) separating the reinforcing sheet. The laminated sheet comprises, in sequence, the substrate, the first release layer and the metal layer, and in other words includes a releasable substrate. In addition, the reinforcing sheet has a lower Vickers hardness than that of the substrate. In the production of the multilayer wiring board, the reinforcing sheet having a lower Vickers hardness than that of the substrate is stacked on the laminate provided with the multilayer wiring layer including the releasable substrate. As a result, the reliability of connection in the multilayer wiring layer and the flatness (coplanarity) on the surface of the multilayer wiring layer can be improved because the multilayer wiring layer can be reinforced without large local warpage of the multilayer wiring layer.

Steps (1) to (9) will now be described with reference to FIGS. 1 to 3.

(1) Provision of Laminated Sheet

Figure 1:
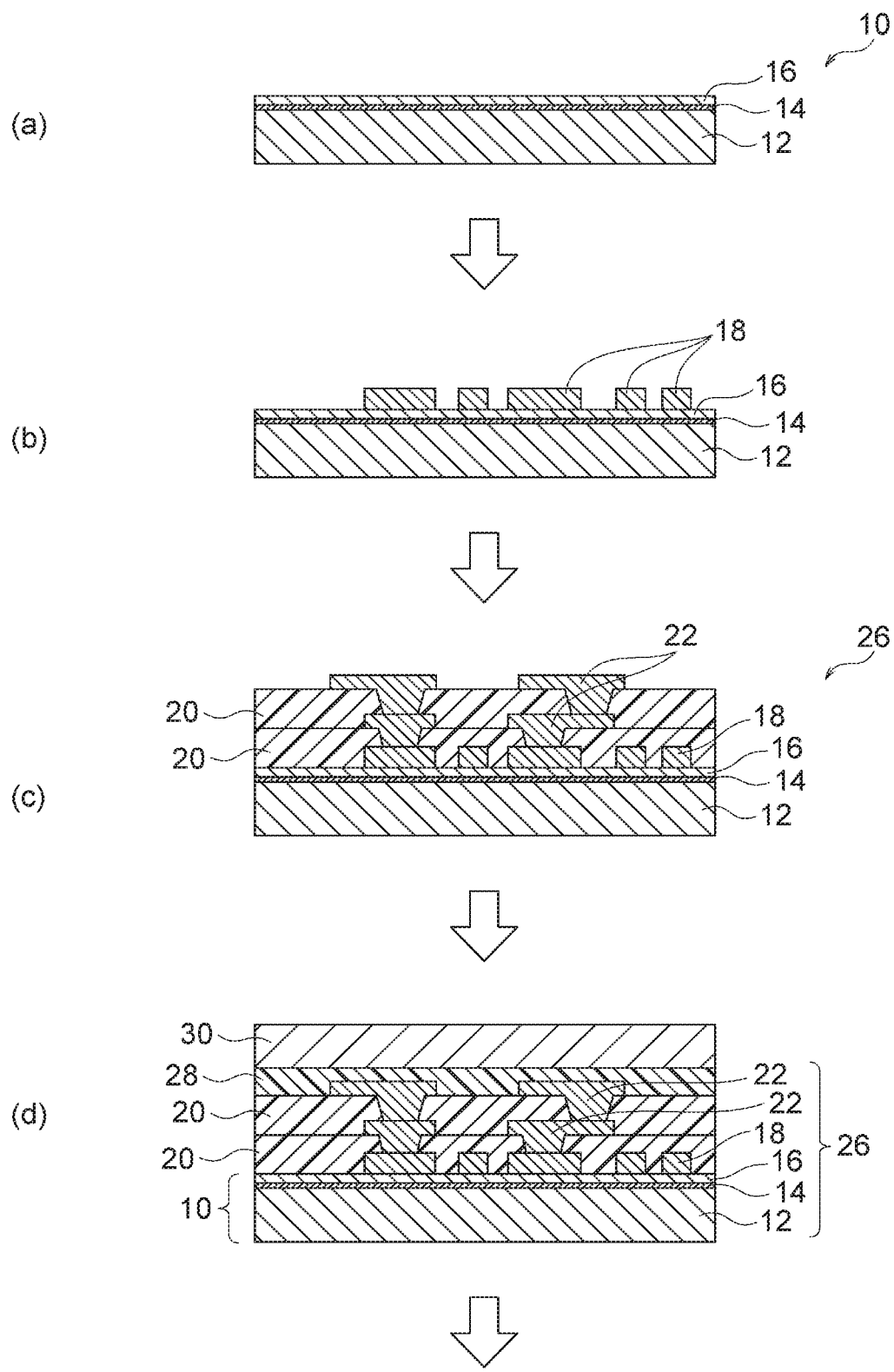
FIG. 1 is a flow chart illustrating the steps from provision of a laminated sheet to stacking of a reinforcing sheet in a method of the present invention.

With reference to FIG. 1 (a), a laminated sheet 10 is provided as a base to form a multilayer wiring board. The laminated sheet 10 includes, in sequence, a substrate 12, a first release layer 14, and a metal layer 16. The laminated sheet 10 may be in the form of a so-called copper foil with a carrier.

The substrate 12 may be made of any material, such as glass, ceramic, resin, or metal. The substrate 12 may have any form, for example, a sheet, a film, a plate, or a foil. Further, the substrate 12 may be a laminate of these sheets, films, plates and/or foils. For example, the substrate 12 may function as a rigid support, such as a glass plate, a ceramic plate or a metal plate, or may be in the form having no rigidity, such as a metal foil or a resin film. Preferred examples of the substrate 12 include metal sheets, glass sheets, ceramic plates, laminates of metal sheets and prepregs, metal sheets coated with adhesives, and resin sheets (in particular hard resin sheets). Preferred examples of the metal of the substrate 12 include copper, titanium, nickel, stainless steel, and aluminum. Preferred examples of the ceramics include alumina, zirconia, silicon nitride, and aluminum nitride (fine ceramics). Preferred examples of the resin include epoxy resins, aramid resins, polyimide resins, polyamide or nylon resins, liquid crystal polymers, PEEK resins, polyamideimide resins, polyethersulfone resins, polyphenylene sulfide resins, PTFE resins, and ETFE resins. More preferably the thermal expansion coefficient (CTE) is less than 25 ppm/K (preferably 1.0 to 23 ppm/K, more preferably 1 0 to 15 ppm/K, further more preferably 1.0 to 10 ppm/K), from the viewpoint of preventing warpage of the coreless support due to heat when an electronic device is mounted. Examples of such materials include various resins as described above (especially resins with low thermal expansion, such as polyimide resins or liquid crystal polymers), prepregs made of various resins and glass fibers as described above, glass, and ceramics. In view of handling properties and securing the flatness when a chip is mounted, the substrate 12 has s Vickers hardness of, preferably 500 to 3000 HV, more preferably 550 to 2500 HV, further more preferably 600 to 2000 HV For materials that satisfies these properties, the substrate 12 is preferably composed of a resin film, glass or ceramic, more preferably glass or ceramic, particularly more preferably glass. For example, a glass sheet used in the substrate 12 has light weight, low thermal expansion coefficient, high insulating property, high rigidity, and high surface flatness and thus the metal layer 16 has a significantly smooth surface. In addition, the glass sheet used in the substrate 12 has some advantages that exhibit, for example, surface flatness (coplanarity) favorable to mounting of the electronic device, and chemical resistance during the desmear step and various plating steps in a manufacturing process of the printed wiring board. Preferred examples of the glass constituting the substrate 12 include quartz glass, borosilicate glass, alkali-free glass, soda-lime glass, aminosilicate glass, and combinations thereof, particularly more preferably alkali-free glass. The alkali-free glass is glass that contains substantially no alkali metal and contains silicon dioxide, aluminum oxide, boron oxide, an alkaline earth metal oxide, such as calcium oxide or barium oxide as main components, and further contains boric acid. Since the alkali-free glass has a low thermal expansion coefficient in the range of 3 to 5 ppm/K over a wide temperature range from 0° C. to 350° C., the warpage of the glass can be advantageously minimized when a semiconductor chip as an electronic device is mounted.

The substrate 12 has a thickness of preferably from 100 to 2000 μm, more preferably from 300 to 1800 μm, further more preferably from 400 to 1100 μm. At a thickness within such ranges, the printed wiring board can be thinned with retaining adequate strength that does not interfere handling and electronic parts can be mounted with reduced warpage.

The surface of the substrate 12 adjacent to the first release layer 14 (adjacent to an adhesive metal layer if present) has an arithmetic mean roughness Ra of preferably 0.1 to 70 nm, more preferably 0.5 to 60 nm, further more preferably 1.0 to 50 nm, particularly more preferably 1.5 to 40 nm, most preferably 2.0 to 30 nm as measured in accordance with JIS B 0601-2001. The smaller arithmetic mean roughness on the surface of the substrate 12 adjacent to the first release layer 14 desirably causes smaller arithmetic mean roughness Ra on the surface of the metal layer 16 remote from the first release layer 14 (the outer surface of the metal layer 16). As a result, the roughness Ra is suitable for forming a wiring pattern highly refined to a line/space (US) ratio of 13 μm or less/13 μm or less (for example, from 12 μm/12 μm to 1 μm/1 μm) in a printed wiring board manufactured with the laminated sheet 10.

Optionally, the laminated sheet 10 may have an adhesive metal layer and/or an auxiliary release layer on the surface of the substrate 12 adjacent to the first release layer 14, and preferably, in sequence, the adhesive metal layer and the auxiliary release layer.

An optional adhesive metal layer is preferably composed of at least one metal selected from the group consisting of Ti, Cr and Ni, and may be a pure metal or an alloy from the viewpoint of assuring the adhesion to the substrate 12. The metal composed of the adhesive metal layer may contain incidental impurities derived from, for example, raw material components and a formation process of film. Also, the metal may contain oxygen derived from the air when the adhesive metal layer is exposed to the atmosphere after the formation of film. The adhesive metal layer is preferably formed by a gas-phase process such as sputtering. In particular, the adhesive metal layer is preferably formed by a magnetron sputtering process with a metal target because the process can improve the uniformity of distribution in film thickness. The adhesive metal layer has a thickness of preferably 5 to 500 nm, more preferably 10 to 300 nm, further more preferably 18 to 200 nm, particularly more preferably 20 to 150 nm. The thickness is measured by analyzing the cross-sectional area of the layer with an energy dispersive X-ray spectrometer in a transmission electron microscope (TEM-EDX).

An optional auxiliary release layer is preferably composed of copper in view of controlling release strength between the auxiliary release layer and the first release layer 14 into a desired value. The copper that constitutes the auxiliary release layer may contain incidental impurities derived from, for example, raw material components or a formation process of film. Also, the metal may contain oxygen derived from the air when the auxiliary release layer is exposed to the atmosphere before and after the formation of film. However, the adhesive metal layer and the auxiliary release layer may be preferably continuously formed without exposing to the atmosphere. The auxiliary release layer is preferably formed by a gas-phase process such as sputtering. In particular, the auxiliary release layer is preferably formed by a magnetron sputtering process with a copper target because the process can improve the uniformity of distribution in film thickness. The auxiliary release layer has a thickness of preferably 5 to 500 nm, more preferably 10 to 400 nm, further more preferably 15 to 300 nm, particularly more preferably 20 to 200 nm. The thickness is measured by analyzing the cross-sectional area of the layer with an energy dispersive X-ray spectrometer in a transmission electron microscope (TEM-EDX).

The first release layer 14 may be composed of any material that enables separation of the substrate 12. For example, the first release layer 14 can be composed of a known material employed as a release layer of a copper foil with a carrier. The first release layer 14 may be either an organic release layer or an inorganic release layer. Examples of organic components used in the organic release layer include nitrogen-containing organic compounds, sulfur-containing organic compounds, and carboxylic acids. Examples of the nitrogen-containing organic compounds include triazole compounds and imidazole compounds. Examples of the inorganic components used in the inorganic release layer include at least one metal oxide selected from the group consisting of Ni, Mo, Co, Cr, Fe, Ti, W, P and Zn, mixture of metals and nonmetals, and carbon. It is preferred that the first release layer 14 is a layer mainly containing carbon, more preferably a layer mainly composed of carbon or hydrocarbon, and further more preferably a hard carbon film of amorphous carbon, or a carbon-nitrogen mixture from the viewpoint of releasability and film forming property. In this case, the first release layer 14 (i.e. the carbon layer) has preferably a carbon content of 60 atomic % or more, more preferably 70 atomic % or more, further more preferably 80 atomic % or more, particularly more preferably 85 atomic % or more, measured by XPS. The carbon content has no upper limit and may be 100 atomic % or practically 98 atomic % or less. The first release layer 14 (particularly, the carbon layer) may contain incidental impurities (for example, oxygen, carbon and hydrogen derived from an atmospheric environment). In addition, metal atoms may be added to the first release layer 14 (in particular, the carbon layer) depending on a process of forming the metal layer 16. Since carbon has low diffusion to and low reactivity with the substrate 12, the formation of the metallic bond between the metal layer 16 (e.g., copper foil layer) and the bonding interface can be prevented at an elevated temperature, and the substrate 12 can be maintained under a condition where separation and removal are ready even when a press working is carried out at a temperature exceeding 300'C. The first release layer 14 is preferably formed by a gas-phase process such as sputtering, in order to avoid excess impurities in the amorphous carbon and to achieve continuous formation of the film and the adhesive metal layer and/or auxiliary release layer. The first release layer 14 has a thickness of preferably 1 to 20 nm, more preferably 1 to 10 nm. The thickness is measured by analyzing the cross-sectional area of the layer with an energy dispersive X-ray spectrometer in a transmission electron microscope (TEM-EDX).

The first release layer 14 preferably has a release strength of 1 to 30 gf/cm, more preferably 3 to 20 gf/cm, further more preferably 4 to 15 gf/cm in order to minimize the stress concentration to the first wiring layer 18 and thereby facilitate the separation process when the first release layer 14 is separated. The release strength of the first release layer 14 is measured as follows. First, a first release layer 14 is formed on a substrate 12, a copper layer as a metal layer 16 is formed on the first release layer to give a laminated sheet, an electroplated copper film having a thickness of 18 μm is formed on the laminated sheet, and a copper-clad laminate is thereby formed. Second, the release strength (gf/cm) is measured in accordance with JIS C 6481-1996 when the electroplated copper film integrated with the metal layer 16 is separated.

The release strength of the first release layer 14 can be adjusted by, for example, controlling the thickness of the first release layer 14, or selecting the composition of the first release layer 14.

The metal layer 16 is composed of metal, and preferably includes a power supply sublayer to supply power to the first wiring layer 18 described below. The metal layer 16 or the power supply sublayer may be a copper foil produced by any process, for example, a wet process, such as an electroless copper plating or an electrolytic copper plating; a physical vapor deposition process, such as sputtering or vacuum vapor deposition; chemical vapor deposition; or a combination thereof. The preferred metal that constitutes the power supply sublayer is copper and thus the preferred power supply sublayer can be an extremely thin copper layer. The power supply sublayer is composed of particularly preferably a copper layer deposited by a gas-phase process, such as sputtering or vacuum vapor deposition, and most preferably a copper layer deposited by the sputtering in order to appropriately build a fine pitch through an extremely thinning process. Although the extremely thin copper layer is preferably a non-roughened copper layer, it may be subjected to preliminary roughening or secondary roughening, such as soft etching, cleaning, or oxidation-reduction, as long as the roughening process does not interfere with the formation of a wiring pattern when a printed wiring board is manufactured. The power supply sublayer (for example, an extremely thin copper layer) constituting the metal layer 16 may have any thickness of, preferably 50 to 3000 nm, more preferably 70 to 2500 nm, further more preferably 80 to 2000 nm, particularly preferably 90 to 1500 nm, particularly more preferably 120 to 1000 nm, most preferably 150 to 500 nm in order to form a fine pitch as described above. The power supply sublayer having a thickness within the above range (for example, an extremely thin copper layer) is preferably manufactured by a sputtering process from the viewpoint of the in-plane uniformity of the layer thickness and the productivity to yield a layer in the form of a sheet or a roll.

The surface of the metal layer 16 remote from the first release layer 14 (the outer surface of the metal layer 16) has an arithmetic mean roughness Ra of preferably 1.0 to 100 nm, more preferably 2.0 to 40 nm, further more preferably 3.0 to 35 nm, particularly more preferably 4.0 to 30 nm, most preferably from 5.0 to 15 nm as measured in accordance with JIS B 0601-2001. A smaller arithmetic mean roughness is suitable for forming a wiring pattern more highly refined to a line/space (l/S) ratio of 13 μm or less/13 μm or less (for example, from 12 μm/12 μm to 1 μm/1 μm) in a printed wiring board manufactured with the laminated sheet 10. In the case of such a smooth surface, a contactless surface roughness measurement is preferably employed in the measurement of the arithmetic mean roughness Ra.

The metal layer 16 may have a multilayer structure composed of two or more sublayers. For example, the metal layer 16 may have an antireflection sublayer on the surface of the power supply sublayer adjacent to the first release layer 14 in addition to the power supply sublayer. In other words, the metal layer 16 may include the power supply sublayer and the antireflection sublayer. The antireflection sublayer is preferably composed of at least one metal selected from the group consisting of Cr, W, Ta, Ti, Ni and Mo. At least the surface of the antireflection sublayer adjacent to the power supply sublayer is preferably composed of aggregates of metal particles. The antireflection sublayer may have a structure which is entirely composed of the aggregates of metal particles, or a multilayer structure including a subsublayer composed of the aggregates of metal particles and a subsublayer that is not composed of particles below the subsublayer composed of the particles. The aggregates of metal particles constituting the surface of the antireflection sublayer adjacent to the power supply sublayer exhibits a desirable dark color caused by a metal material and a particulate form, and the dark color results in a desirable visual contrast to the wiring layer composed of copper and thereby improves the visibility in image inspection (for example, automatic optical inspection (AOI)). Accordingly, the surface of the antireflection sublayer irregularly reflects light due to a convex shape of the metal particles to be recognized as the black color. In addition, the antireflection sublayer has appropriate adhesion and separability to the first release layer 14, excellent adhesion to the power supply sublayer, and excellent separation resistance to the developer when a photoresist layer is formed. The surface of the antireflection sublayer adjacent to the power supply sublayer preferably has a glossiness Gs (at 60°) of 500 or less, more preferably 450 or less, further more preferably 400 or less, particularly more preferably 350 or less, most preferably 300 or less in view of improvements in contrast and visibility. Since a lower limit of the glossiness Gs (at 60°) is preferably as low as possible, the glossiness Gs (at 60°) on the surface of the antireflection sublayer adjacent to the power supply sublayer may be any low value of, practically 100 or more, and more practically 150 or more. Specular glossiness Gs (at 60°) by image analysis of roughened particles can be measured with a commercially available glossiness meter in accordance with JIS Z 8741-1997 (specular glossiness—method of measurement).

In order to improve the contrast and the visibility and to enhance the uniformity of flash etching, the surface of the antireflection sublayer adjacent to the power supply sublayer is composed of aggregates of metal particles. In such particles, the equivalent circle diameter of a projected area determined by SEM image analysis is preferably 10 to 100 nm, more preferably 25 to 100 nm, further more preferably 65 to 95 nm. The equivalent circle diameter of the projected area can be measured by photographing the surface of the antireflection sublayer at a predetermined magnification (for example, 50,000 folds) with a scanning electron microscope and analyzing the resultant SEM images. In particular, the arithmetic mean value of the equivalent circle diameters of the projected area is employed in this measurement where the equivalent circle diameters are measured with commercially available software for image analytical particle size distribution (for example, Mac-VIEW manufactured by Mountech Co., Ltd.).

The antireflection sublayer is composed of at least one metal selected from Cr, W, Ta, Ti, Ni and Mo, preferably at least one metal selected from Ta, Ti, Ni and Mo, more preferably at least one metal selected from Ti, Ni and Mo, most preferably Ti. These metals may be pure metals or alloys. In any case, these metals are preferably not inherently oxidized (essentially not metal oxides) to exhibit a desired dark color which can improve a visual contrast to Cu. In particular, the antireflection sublayer has an oxygen content of preferably 0 to 15 atomic %, more preferably 0 to 13 atomic %, further more preferably 1 to 10 atomic %. In any case, the metals do not dissolve in a copper flash etching solution, and thereby can exhibit excellent chemical resistance to the copper flash etching solution. The antireflection sublayer has a thickness of preferably 1 to 500 nm, more preferably 10 to 300 nm, further more preferably 20 to 200 nm, most preferably 30 to 150 nm.

(2) Formation of First Wiring Layer

With reference to FIG. 1 (b), a first wiring layer 18 is formed on a surface of the metal layer 16. Typically, the first wiring layer 18 is formed through formation of a photoresist layer, formation of an electroplated copper layer, separation of the photoresist layer, and optional copper flash etching in accordance with a known procedure. For example, the photoresist layer is formed into a predetermined pattern on the surface of the metal layer 16. The photoresist is preferably a photosensitive film, such as a photosensitive dry film. The photoresist layer may be provided with a predetermined wiring pattern through exposure and development. The electroplated copper layer is formed on the exposed surface of the metal layer 16 (that is, a portion not masked with the photoresist layer). Copper may be electroplated by any known process. The photoresist layer is then removed. As a result, the electroplated copper layer remains in the form of the first wiring layer 18, and the metal layer 16 is exposed at a portion or portions where the wiring pattern is not formed.

In the case that the metal layer 16 includes not only the power supply sublayer but also the antireflection sublayer, a portion corresponding to the power supply sublayer of the metal layer 16 may be removed by flash etching to expose the antireflection sublayer. This facilitates the image inspection of the first wiring layer 18 described later. A solution for the flash etching process is preferably a mixture of sulfuric acid and hydrogen peroxide or a solution containing at least one of sodium persulfate and potassium persulfate in order to reliably etch the exposed metal layer 16 while avoiding excessive etching of the electroplated copper layer. The antireflection sublayer, if present in the metal layer, also remains undissolved with the flash etching solution and is exposed on the surface at the portion where the wiring pattern is not formed. In this case, since at least one of metal selected from Cr, W, Ta, T, Ni and Mo which can constitute the antireflection sublayer does not dissolve in the copper flash etching solution, the antireflective layer can exhibit excellent chemical resistance to the copper flash etching solution. Accordingly, the antireflective sublayer, even if present, is not removed with the copper flash etching solution, and is preferably remained in the exposed state for optional subsequent image inspection process.

After the copper flash etching process, the coreless support provided with the wiring layer (more specifically the first wiring layer 18) may optionally be subjected to an image inspection process while the antireflection sublayer remains exposed. Typically, the image inspection is performed with an automatic optical inspection (AOI) device through irradiation with predetermined light from a light source to yield a binary image of a wiring pattern, perform pattern matching of the binarized image with the designed pattern image, and determine whether both images are matched or not. If the surface of the antireflection sublayer is composed of aggregates of metal particles, the particles exhibit a desirable dark color caused by a metal material and a particulate form, and the visibility in image inspection (for example, automatic optical inspection (AOI)) is improved because the dark color provides a visual contrast to the first wiring layer 18.

(3) Formation of Laminate Provided with Multilayer Wiring Layer

With reference to FIG. 1 (c), insulating layers 20 and wiring layers 22 are alternately stacked on the surface of the laminated sheet 10 at which the first wiring layer 18 is formed to give a multilayer wiring layer 26 in which the first wiring layer 18 is incorporated as an embedded wiring layer. The number of wiring layers 22 may be one or more, and the layer can also be referred to as the n-th wiring layer 22 (n is an integer of 2 or more), like the expression of the first wiring layer 18. The number of the insulating layers 20 may be one or more. In other words, the multilayer wiring board 40 of the present invention has at least two wiring layers (i.e., at least the first wiring layer 18 and the second wiring layer 22) together with at least one insulating layer 20. The sequentially stacked structure composed of the first wiring layer 18, the n-th wiring layers 22, and the insulating layers 20 is generally referred to as a build-up layer or a build-up wiring layer. The method in the present invention may be any process, and employ a known build-up wiring layer configuration used in a general printed wiring board.

A solder resist layer and/or a surface metal treatment layer (for example, an organic solderability preservative (OSP) treatment layer, a plated Au layer, and a plated Ni—Au layer) may be formed on the wiring layer at the outermost surface of the build-up wiring layer.

(4) Stacking of Reinforcing Sheet

With reference to FIG. 1 (d), a reinforcing sheet 30 having a lower Vickers hardness than that of the substrate 12 is stacked through a second release layer 28 on the laminate provided with the multilayer wiring layer 26 at the side opposite to the laminated sheet 10. Since the Vickers hardness of the reinforcing sheet 30 is lower than that of the substrate 12, the reinforcing sheet 30 itself deflects preferentially over the substrate 12 when the reinforcing sheet 30 is stacked, and the stress generated during the stacking can be appropriately released by the reinforcing sheet 30 itself. As a result, the warpage of the laminate provided with the multilayer wiring layer 26 including the substrate 12 can be prevented or reduced effectively. Accordingly, the laminate provided with the multilayer wiring layer 26 is reinforced with the reinforcing sheet 30 without large local warpage. In other words, the warpage during separation can be prevented or reduced effectively. In this manner, disconnection and separation of the wiring layer inside the build-up wiring layer, which may be caused by the warpage, can be avoided, and the reliability of connection in the multilayer wiring layer can be improved. In addition, the flatness (coplanarity) on the surface of the multilayer wiring layer can be improved because the warpage is prevented or reduced effectively.

Specifically, the rate of the Vickers hardness of the reinforcing sheet 30 to the Vickers hardness of the substrate 12 is preferably 2 to 99%, more preferably 6 to 90%, further more preferably 10 to 85%. Preferably, the reinforcing sheet 30 exhibits a Vickers hardness of 50 to 700 HV and the substrate 12 exhibits a Vickers hardness of 500 to 3000 HV, more preferably the reinforcing sheet 30 exhibits a Vickers hardness of 150 to 550 HV and the substrate 12 exhibits a Vickers hardness of 550 to 2500 HV, and further more preferably the reinforcing sheet 30 exhibits a Vickers hardness of 200 to 500 HV and the substrate 12 exhibits a Vickers hardness of 600 to 2000 HV In the present specification, the Vickers hardness is measured in accordance with the "Vickers hardness test" described in JIS Z 2244-2009.

For reference, the Vickers hardness HV of various candidate materials is exemplified as follows: sapphire glass (2300 HV), hard metal alloy (1700 HV), cermet (1650 HV), quartz (rock crystal) (1103 HV), SKH 56 (high speed tool steel, HSS) (722 HV), tempered glass (640 HV), SUS 440 C (stainless steel) (615 HV), SUS 630 (stainless steel) (375 HV), titanium alloy 60-type (64 titanium alloy) (about 280 HV), Inconel (heat resistant nickel alloy) (150 to 280 HV), S 45 C (carbon steel for machine structural use) (201 to 269 HV), Hastelloy alloy (corrosion resistant nickel alloy) (100 to 230 HV), SUS 304 (stainless steel) (187 HV), SUS 430 (stainless steel) (183 HV), cast iron (160 to 180 HV), titanium alloy (110 to 150 HV), brass (80 to 150 HV), and bronze (50 to 100 HV).

The reinforcing sheet 30 has a spring deflection limit $Kb_{0.1}$ of preferably 100 to 1500 N/mm², more preferably 150 to 1200 N/mm², further more preferably 200 to 1000 N/mm² as measured in accordance with the repeated deflection test of JIS H 3130-2012. Within such ranges, when the reinforcing sheet 30 is stacked or separated, the reinforcing sheet 30 itself is deflected, such that the stress that may be generated during stacking or separating can be appropriately released and thereby the warpage of the laminate provided with the multilayer wiring layer 26 including the substrate 12 can be more effectively prevented or reduced. Also, since the reinforcing sheet 30 flexed when stacked or separated can instantaneously return back to the original flat shape by employing its elasticity, the flatness of the laminate provided with the multilayer wiring layer 26 can be more effectively maintained. In addition, use of the tenacity and elasticity of the reinforcing sheet 30 can urge the reinforcing sheet 30 to which the separating force is applied in the direction of the separation (that is, in the direction away from the laminate provided with the multilayer wiring layer 26), resulting in further smooth separation.

For reference, spring deflection limits $Kb_{0.1}$ for various candidate materials are illustrated in Tables 1 and 2.

TABLE 1

| Material (JIS Number) | Tempering | $Kb_{0.1}$ |
|---|---|---|
| SUS301CSP (stainless steel) | ½H | 315 |
| | ¾H | 390 |
| | H | 490 |
| | EH | 590 |
| | SHE(1) | 650 |
| SUS304CSP (stainless steel) | ½H | 275 |
| | ¾H | 335 |
| | H | 390 |
| SUS631CSP (stainless steel) | O | 635 |
| | ½H | 635 |
| | ¾H | 835 |
| | H | 980 |
| SUS632J1CSP (stainless steel) | ½H | 1200 |
| | ¾H | 1400 |
| C1700 (beryllium-copper alloy) | O | 685 |
| | ¼H | 785 |
| | ½H | 835 |
| | H | 855 |
| C1720 (beryllium-copper alloy) | O | 735 |
| | ¼H | 835 |
| | ½H | 885 |
| | H | 930 |
| C1720M (beryllium-copper alloy) *mill-hardened material | OM | 390 |
| | ¼HM | 440 |
| | ½HM | 540 |
| | HM | 635 |

TABLE 2

| Material (JIS Number) | Tempering | $Kb_{0.1}$ |
|---|---|---|
| C5210 (phosphor bronze) | ½H | 245 |
| | H | 390 |
| | EH | 460 |
| | SH | 510 |
| | ESH | 560 |
| C5240 (phosphor bronze) | H | 430 |
| | EH | 510 |
| | SH | 570 |
| | ESH | 630 |
| | XSH | 700 |
| C7270 (nickel-tin-copper alloy) | O | 490 |
| | ¼H | 590 |
| | ½H | 635 |
| | H | 685 |
| | EH | 735 |
| | SH | 785 |
| C7270M (nickel-tin-copper alloy) *mill-hardened material | OM | 440 |
| | ¼HM | 490 |
| | ½HM | 540 |
| | HM | 590 |
| | EHM | 685 |
| | XHM | 785 |
| C7701 (nickel-zinc-copper alloy) | ½H | 390 |
| | H | 480 |
| | EH | 560 |
| | SH | 620 |
| C1990M (titanium-copper alloy) *mill-hardened material | ¼HM | 440 |
| | EHM | 590 |

The reinforcing sheet 30 may be composed of any material, preferably resin, metal, glass and a combination thereof. Examples of the resin include epoxy resins, polyimide resins, polyethylene resins, phenol resins, and prepregs composed of such resins and fiber reinforcing materials. Examples of the metal include stainless steel, and copper alloy (for example, bronze, phosphor copper, copper-nickel alloy, copper-titanium alloy) from the viewpoint of the Vickers hardness and the spring deflection limit $Kb_{0.1}$, preferably stainless steel from the viewpoint of the chemical resistance. The reinforcing sheet 30 may have any form, such as a sheet, a film, a plate, and a foil, preferably a sheet or a plate, as long as the warpage of the laminate provided with the multilayer wiring layer 26 can be prevented or reduced. The reinforcing sheet 30 may be formed by stacking, for example, these sheets, films, plates, and foils. Typical examples of the reinforcing sheet 30 include a metal sheet, a resin sheet (in particular, a hard resin sheet), and a glass sheet. The reinforcing sheet 30 has a thickness of preferably 10 μm to 1 mm, more preferably 50 to 800 μm, further more preferably 100 to 600 μm. In case that the reinforcing sheet 30 is a metal sheet (for example, stainless steel sheet), a ten-point mean roughness Rz-jis (measured in accordance with JIS B 0601-2001) on the surface of the metal sheet where the second release layer 28 is formed is preferably 0.05 to 500 μm, more preferably 0.5 to 400 μm, further more preferably 1 to 300 μm. Such a surface roughness can enhance the tackiness with the second release layer 28 and improve the release strength in the second release layer 28 due to an anchor effect caused by the irregularities on the surface.

The release strength of the second release layer 28 has preferably 1.02 to 300 times, more preferably 1.05 to 100 times, further more preferably 3.0 to 50 times, particularly more preferably 5.0 to 30 times the release strength of the first release layer 14. For example, the second release layer 28 has a release strength of, preferably 30 to 300 gf/cm, more preferably 40 to 250 gf/cm, further more preferably 50 to 175 gf/cm, particularly more preferably 70 to 150 gf/cm. Within such ranges, a stress concentration on the multilayer wiring layer can be prevented more effectively when the substrate 12 is separated at the first release layer 14, and thereby a disconnection in the multilayer wiring layer can be avoided more effectively. In addition, since unusual separation (linked separation) of the second release layer 28 can be prevented more effectively when the substrate is separated at the first release layer 14, the surface of the first wiring layer 18 after the substrate is separated at the first release layer 14 can be kept flat more definitely. The release strength of the second release layer 28 can be measured basically in the same manner as the above-described method of measuring the release strength of the first release layer 14, but It should be noted that this strength refers to the release strength before the treatment, such as ultraviolet irradiation, heating, and dissolution, to reduce the release strength. Specifically, the release strength of the second release layer 28 is measured as follows. The second release layer 28 is formed on the reinforcing sheet 30, and a copper foil having a thickness of 18 μm is stacked on the second release layer 28 to form a copper-clad laminate. A release strength (gf/cm) is then measured in accordance with JIS C 6481-1996 at the time when the copper foil is separated.

The second release layer 28 may be any layer, which can bond the reinforcing sheet 30 to the laminate provided with the multilayer wiring layer 26 and make the reinforcing sheet 30 separable by any procedure. The second release layer 28 preferably exhibits a higher release strength than that of the first release layer 14 as described above. The second release layer 28 may be a known layer referred to as an adhesive layer, an adhesive release layer, or a release layer (For example, see PTL 4 to 6). A method of comparing the largeness of the release strength in the second release layer 28 with that in the first release layer 14 may be based on the comparison between absolute values of the respective release strengths as described above, or advantageously based on the comparison between the measured values in accordance with the respective separation patterns in the process of manufacturing the multilayer wiring board. Specifically, the release strength of the first release layer 14 may be a first proof stress generated when the substrate 12 is separated from the build-up wiring layer and the release strength of the second release layer 28 may be a second proof stress generated when the reinforcing sheet 30 is separated from the laminate provided with the multilayer wiring layer 26, and the method of comparing the largeness may be advantageously based on the comparison between a first proof stress and a second proof stress. Typically, the second release layer 28 has tackiness, and may be an adhesive layer or an adhesive release layer. However, the second release layer 28 may be a release layer having no tackiness.

A preferred embodiment of the second release layer 28 includes a resin layer containing a foaming agent. The resin layer containing a foaming agent can assist mechanical separation by foaming with heat treatment or ultraviolet treatment before separating, and the release strength can be controlled with the content of the foaming agent and the thickness of the resin layer. PTL 5 (JP2014-214208A) discloses an adhesive layer containing a thermal foaming agent as an example of the resin layer containing a foaming agent that foams with heat treatment. PTL 4 (JP2015-170767A) discloses a release layer including a composition that generates gas due to Irradiation with ultraviolet rays as an example of the resin layer containing a foaming agent that foams with ultraviolet rays.

Another preferred embodiment of the second release layer 28 includes an acid-soluble or alkali-soluble resin layer. The acid-soluble or alkali-soluble resin layer is a layer that enables separation by dissolving with a chemical solution (for example, an acid solution or an alkaline solution), and the release strength thereof is controlled with the content of chemical-soluble components and the thickness of the resin layer.

(5) Separation of Substrate

Figure 2:
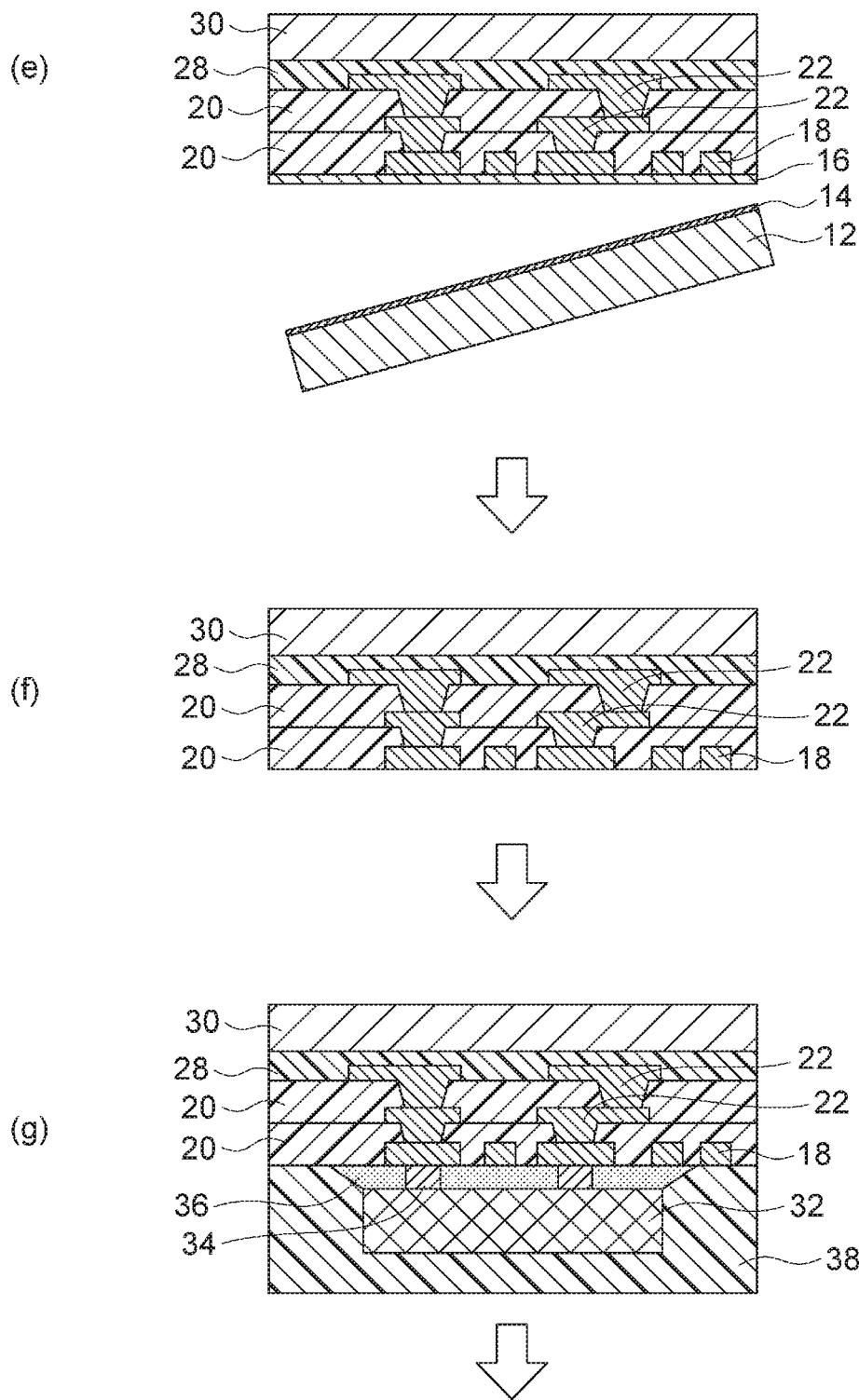
FIG. 2 is a flow chart illustrating the steps from separation of a substrate to mounting of an electronic device in the method of the present invention.

With reference to FIG. 2 (e), the substrate 12 is separated from the metal layer 16 at the first release layer 14. In other words, the substrate 12, the adhesive metal layer (if present), the auxiliary release layer (if present), and the first release layer 14 are separated and removed, preferably by physical separation. The physical separation is based on a procedure of separating the substrate 12 and other layers from the build-up wiring layer with, for example, hands, jigs, and machines. At this time, large local warpage of the laminate provided with the multilayer wiring layer 26 can be prevented because the reinforcing sheet 30 tightly bonded interposing the second release layer 28 reinforces the laminate provided with the multilayer wiring layer 26. That is, the reinforcing sheet 30 can reinforce the laminate provided with the multilayer wiring layer 26 to endure separating force during the separation of the substrate 12 and more effectively prevent or reduce the warpage. In this manner, disconnection and separation in the wiring layer inside the build-up wiring layer, which may be caused by the warpage, can be avoided, resulting in an improvement in the reliability of connection in the multilayer wiring layer. The flatness (coplanarity) on the surface of the multilayer wiring layer can be improved because the warpage is prevented or reduced effectively.

In particular, in the case that the second release layer 28 has a higher release strength than that of the first release layer 14, the separation at the second release layer 28 can be more effectively prevented to facilitate the separation at the first release layer 14 when the substrate 12 is separated. Accordingly, the reinforcing sheet 30 tightly bonded to the laminate provided with the multilayer wiring layer 26 interposing the second release layer 28 therebetween can more stably retain a tightly bonding state even if the substrate 12 is separated.

(6) Etching and Removal of Metal Layer (Optional Step)

With reference to FIG. 2 (f), the metal layer 16 is optionally removed by etching after the separation of the substrate 12 and before separation of the reinforcing sheet 30. The metal layer 16 may be etched based on a known process such as flash etching.

In particular, a process of mounting chips after forming the build-up wiring layer is called RDL-first process as described above. In this process, since a visual external inspection and an electrical inspection of the multilayer wiring layer (that is, the first wiring layer 18 and the n-th wiring layer 22) can be performed before mounting of the chips, the defective portions of each wiring layer can be excluded to mount the chips on non-defective portions only. As a result, the RDL-first process has an economical advantage as compared with the chip-first process in which the wiring layers are sequentially stacked on the surface of the chip because the wasteful use of the chips can be avoided. Accordingly, in the manufacturing process of the printed wiring board (in particular, in the RDL-first process), a product yield can be enhanced by performing the visual external inspection and the electrical inspection on the wiring layer before mounting of chips.

(7) Surface Treatment of First Wiring Layer (Optional Step)

After the above step, a solder resist layer, a surface metal treatment layer (for example, the organic solderability preservative (OSP) treatment layer, an Au plated layer, and a Ni—Au plated layer), a metal pillar for mounting electronic devices, and/or a solder bump may be optionally formed on the surface of the first wiring layer 18.

(8) Mounting of Electronic Devices (Optional Process)

With reference to FIG. 2 (*g*), an optional electronic device 32 may be mounted on the surface of the first wiring layer 18 after the removal of the metal layer 16 (or after the subsequent electrical inspection) and before the separation of the reinforcing sheet 30. In the method of manufacturing in the present invention, excellent surface flatness (coplanarity) which is favorable for mounting of the electronic device 32 can be achieved by employing the second release layer 28 and the reinforcing sheet 30. As a result, a connection yield can be enhanced when the electronic devices are mounted.

Examples of the electronic device 32 include semiconductor devices, chip capacitors, and resistors. Examples of process for mounting electronic devices include a flip chip mounting process, and a die bonding process. In the flip chip mounting process, bonding pads of the electronic device 32 are bonded to the first wiring layer 18. With reference to FIG. 2 (*g*), columnar electrodes (pillars) or solder bumps 34 may be formed on the mounting pads, and a sealing resin film 36 or a non-conductive film (NCF) is formed on the surface including the first wiring layer 18 before mounting. The bonding is preferably performed with a low melting point metal such as solder, or an anisotropic conductive film. In an adhesion step of the die bonding process, the surface opposite to the mounting pad surface of the electronic device 32 is bonded to the first wiring layer 18. In this adhesion step, it is preferred to use of a paste or a film which is composed of a resin composition containing a thermosetting resin and a thermally conductive inorganic filler. In any process, the electronic device 32 is preferably sealed with the sealing material 38 as shown in FIG. 2 (*g*).

(9) Separation of Reinforcing Sheet

Figure 3:
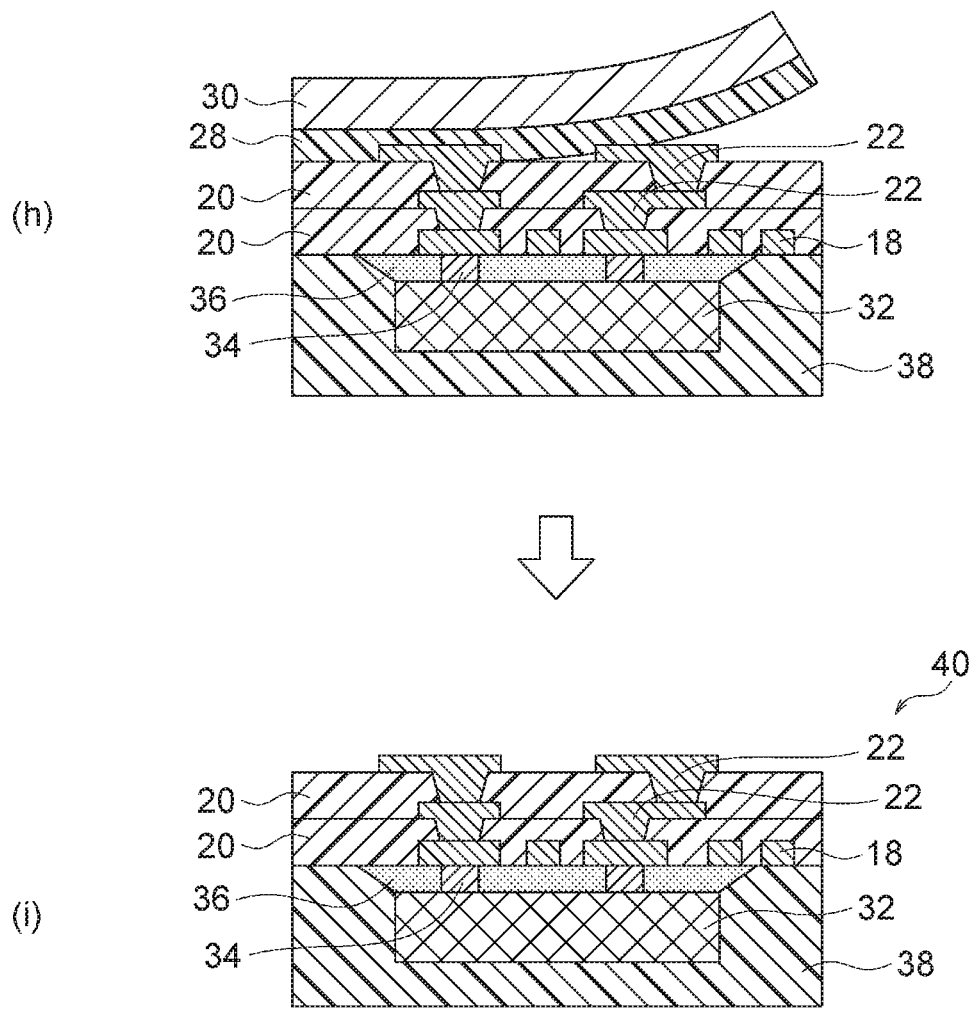
FIG. 3 is a flow chart illustrating the steps from separation of a reinforcing sheet to completion of a multilayer wiring board in the method of the present invention.

With reference to FIGS. 3 (*h*) and (*i*), the reinforcing sheet 30 is separated from the laminate provided with the multilayer wiring layer 26 at the second release layer 28 to give the multilayer wiring board 40. This separation step may involve a physical separation process or a chemical separation process, for example. In the physical separation process, the reinforcing sheet 30 is separated from the build-up wiring layer with, for example, hands, jigs, and machines to give a multilayer wiring board 40. In this case, the second release layer 28 is more difficult to be separated than the first release layer 14 because the second release layer 28 has a higher release strength than that of the first release layer 14. In the case where the second release layer is composed of a resin layer containing a foaming agent as described above, the foaming agent in the second release layer 28 is foamed by heat treatment or ultraviolet treatment before separating and the second release layer 28 turns to a brittle state to facilitate the physical separation. Alternatively, in the case where the second release layer 28 is composed of an acid-soluble or an alkali-soluble layer, the second release layer 28 can be dissolved with chemical solution (for example, an acid solution or an alkaline solution) to facilitate the physical separation. Meanwhile, in the case involving the chemical separation process, the multilayer wiring board 40 can be produced by dissolving both the reinforcing sheet 30 and the second release layer 28 with an etching solution.

(10) Others

At least one side of the substrate 12 and/or the reinforcing sheet 30 preferably extends from the end portion of the build-up wiring layer. Such extension enables the end portion to be grasped and has an advantage to facilitate the separation when the substrate or the reinforcing sheet is separated.

The invention claimed is:

1. A method of manufacturing a multilayer wiring board, the method comprising:
   providing a laminated sheet including, in sequence, a substrate, a first release layer, and a metal layer;
   forming a first wiring layer on the metal layer;
   alternately stacking insulating layers and wiring layers on the laminated sheet on which the first wiring layer is formed to give a laminate provided with a multilayer wiring layer, the first wiring layer being incorporated in the form of an embedded wiring layer;
   stacking a reinforcing sheet having a lower Vickers hardness than that of the substrate on the laminate provided with the multilayer wiring layer at the side opposite to the laminated sheet, while interposing a second release layer;
   separating the substrate from the metal layer at the first release layer; and
   separating the reinforcing sheet from the laminate provided with the multilayer wiring layer at the second release layer to give the multilayer wiring board,
   wherein the substrate is composed of glass.

2. The method according to claim 1, further comprising:
   removing the metal layer by etching after separating the substrate and before separating the reinforcing sheet.

3. The method according to claim 1, wherein a rate of the Vickers hardness of the reinforcing sheet to the Vickers hardness of the substrate is 2 to 99%.

4. The method according to claim 1, wherein a rate of the Vickers hardness of the reinforcing sheet to the Vickers hardness of the substrate is 6 to 90%.

5. The method according to claim 1, wherein a rate of the Vickers hardness of the reinforcing sheet to the Vickers hardness of the substrate is 10 to 85%.

6. The method according to claim 1, wherein the reinforcing sheet exhibits a Vickers hardness of 50 to 700 HV and the substrate exhibits a Vickers hardness of 500 to 3000 HV.

7. The method according to claim 1, wherein the reinforcing sheet exhibits a Vickers hardness of 150 to 550 HV and the substrate exhibits a Vickers hardness of 550 to 2500 HV.

8. The method according to claim 1, wherein the reinforcing sheet exhibits a Vickers hardness of 200 to 500 HV and the substrate exhibits a Vickers hardness of 600 to 2000 HV.

9. The method according to claim 1, wherein the reinforcing sheet has a spring deflection limit $Kb_{0.1}$ of 100 to 1500 N/mm$^2$ as measured in accordance with JIS H 3130: 2012.

10. The method according to claim 1, wherein the reinforcing sheet has a spring deflection limit $Kb_{0.1}$ of 150 to 1200 N/mm$^2$ as measured in accordance with JIS H 3130: 2012.

11. The method according to claim 1, wherein the reinforcing sheet has a spring deflection limit $Kb_{0.1}$ of 200 to 1000 N/mm$^2$ as measured in accordance with JIS H 3130: 2012.

12. The method according to claim 1, further comprising
   removing the metal layer by etching after separating the substrate and before separating the reinforcing sheet; and mounting an electronic device on a surface of the first wiring layer after removing the metal layer and before separating the reinforcing sheet.

\* \* \* \* \*